United States Patent [19]

Owen, III

[11] 4,450,402
[45] May 22, 1984

[54] INTEGRATED CIRCUIT TESTING APPARATUS

[75] Inventor: William H. Owen, III, Mountain View, Calif.

[73] Assignee: Xicor, Inc., Milpitas, Calif.

[21] Appl. No.: 252,232

[22] Filed: Apr. 8, 1981

[51] Int. Cl.³ ............................................. G01R 31/28
[52] U.S. Cl. ................................................... 324/73 R
[58] Field of Search ............ 324/73 R, 73 AT, 158 R, 324/158 T; 371/15

[56] References Cited

U.S. PATENT DOCUMENTS

| | | | |
|---|---|---|---|
| 4,336,495 | 6/1982 | Hapke | 324/73 R X |
| 4,339,710 | 7/1982 | Hapke | 324/73 R |
| 4,357,703 | 11/1982 | Van Brunt | 324/73 R X |

OTHER PUBLICATIONS

Harrod, R. D., *Shunting Technique for Testing Electronic Circuitry*, IBM Technical Disclosure Bulletin, vol. 18, No. 1, Jun. 1975, pp. 204, 205.

*Primary Examiner*—Gerard R. Strecker
*Attorney, Agent, or Firm*—Fitch, Even, Tabin & Flannery

[57] ABSTRACT

An integrated testing apparatus provides bidirectional coupling of a high voltage either from an internal source on an integrated circuit to a first external pin on the integrated circuit package, or to the output point of said internal source of high voltage from a voltage source external to the integrated circuit package that is coupled to said first external pin, said coupling occurring in response to an enabling signal externally impressed on a second external pin on said integrated circuit package. The testing apparatus is substantially transparent to normal integrated circuit operation when said enabling signal is removed from said second external pin.

15 Claims, 6 Drawing Figures

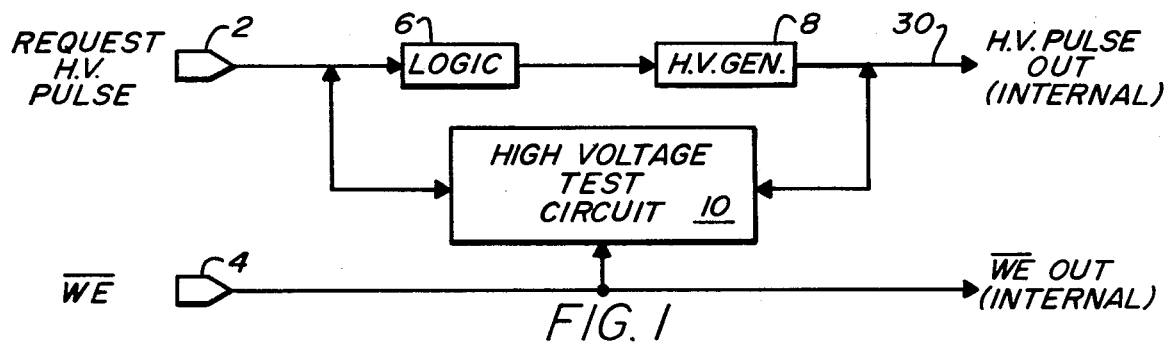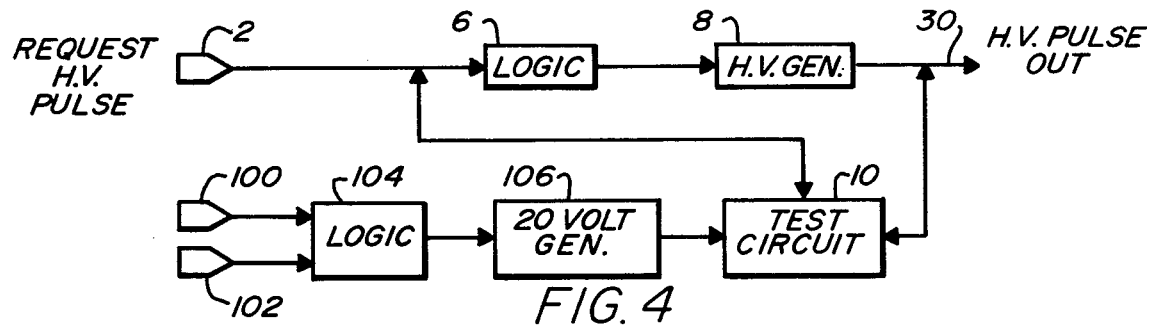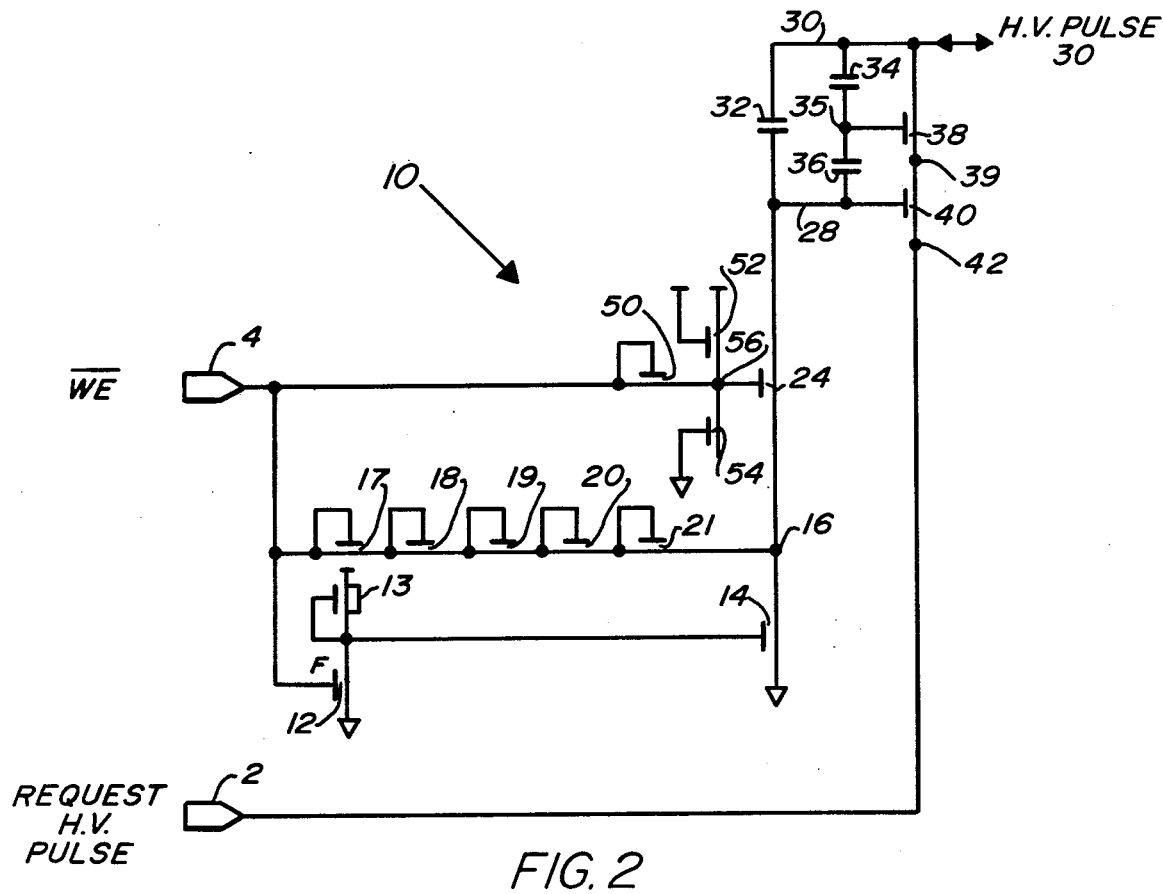

INTEGRATED CIRCUIT TESTING APPARATUS

The present invention relates in general to testing circuits and devices incorporated on an integrated circuit chip, and more particularly to a testing apparatus for enabling the external monitoring of the level of a high voltage signal generated on the same integrated circuit chip, and further enabling an externally generated high voltage signal to be injected into said integrated circuit and coupled to a predetermined point in said circuit via an external pin on the integrated circuit package that is normally used for one or more other functions. The present invention further relates to integrated circuit high voltage steering circuits.

Conventional integrated circuit devices are typically formed on slices of silicon which are cut typically to sizes less than ¼ inch square, called "chips". Each integrated circuit chip is then packaged in a manner so as to enable this chip to be incorporated in a larger electronic system in a convenient conventional way, such as by mounting the packages in a printed circuit board. Usually, the chip package comprises a dual inline package (DIP), or the like, with the chip sealed therein. The DIP may have two or more rows of external pins, with connections made within the package between pads formed on the integrated circuit chip and the external pins by means of gold wire or the like.

One difficulty with manufacturing such integrated circuit devices is that due to the extremely small size of the circuits on the chip, testing of the devices other than via the external pin connections to the integrated circuit chips is difficult especially after the external pins are wired to the chip. Such testing is virtually impossible once the assembly of the package has been completed. Prior to assembly, testing is usually done by attaching probes at specified points on the integrated circuit chip, a time consuming and potentially damaging process.

A solution to this problem would be to provide additional external pin connections for connection to testing circuits also contained on the integrated circuit chip, for facilitating final testing of the device. The drawback of this approach is that such additional external pins add material and labor costs to the cost of manufacturing the integrated circuit chip. It would also create an integrated circuit chip package of larger than necessary size. In addition, users of the integrated circuit are continually demanding that more and more complex integrated circuits be packaged on smaller and smaller chips. Users also only want external pins that function in a manner related to the operation of the integrated circuit device, and not related to circuit testing. Such functional pins usually provide for one or more sources of power to be coupled to the integrated circuit, and, at least in digital logic circuits, one or more logic level signal pins that control the operation of, or are used to either input or output signals from, the integrated circuit device. Conventional digital logic circuits are generally powered from a 5 volt power source and the logic level signals typically vary between 0 and about 4 volts.

Although certain types of circuits have been disclosed in the prior art for enabling external pins to have multiple functions, none are known wherein a logic level signal path is usable as a means for monitoring or manipulating an internal high voltage circuit in such an integrated circuit. Prior art devices have been limited in their ability to interact with and control such high voltage circuits on an integrated circuit chip when the voltage levels of such high voltage signals exceed the 4 or 5 volt maximum gate voltage of the logic element. The circuits used in integrated circuit devices are also intolerant of high voltages, with high voltage breakdown of gated transistors, for example occurring at or above typically 25 volts. What is needed to overcome these problems of testing such high voltage circuits once an integrated circuit has been assembled in a package is a means for testing such internal circuitry without requiring that additional external pins be provided for this testing function, thereby providing a highly advantageous and efficient testing means after construction of the integrated circuit device has been substantially completed.

Therefore, an object of the present invention is to provide an integrated circuit testing apparatus wherein an internally generated high voltage pulse is monitored directly from an existing external pin normally used for other functions.

Another object of the present invention is to provide an integrated circuit testing apparatus wherein an external high voltage pulse is enabled to be injected into the integrated circuit device through an external pin normally used for other functions to enable internal circuit operation to be tested and observed with such a known value of high voltage.

Another object of the present invention is to provide an integrated circuit apparatus for steering a high voltage signal to a predetermined point in the circuit under control of a logic level signal without having the high voltage signal affect any other portion of the circuit.

A further object of the present invention is to provide an integrated circuit testing apparatus wherein a high voltage circuit output voltage is monitored, or a high voltage pulse injected through the use of external pins normally used for other functions, without such additional use affecting or being affected by the circuitry that is connected to such external pins for said normal operation.

Still another object of the present invention is to provide an integrated circuit testing apparatus usable to test the functioning of an internal high voltage generating system after final assembly of the integrated circuit package has been completed.

Yet another object of the present invention is to provide an integrated circuit testing apparatus including means for enabling the high voltage monitoring and injecting means to be a bidirectional function available on a single external pin.

These and other objects and advantages of the present invention will become more apparent upon reference to the accompanying drawings and following description, in which:

FIG. 1 is a partial block diagram of an integrated circuit device illustrating a preferred placement of a high voltage test circuit according to the present invention with respect to other internal circuitry in said integrated circuit;

FIG. 2 illustrates a detailed schematic of the high voltage test circuit according to the present invention;

FIG. 4 illustrates an alternate embodiment for initiating the testing functions of the high voltage test circuit according to the present invention.

Figure 3A:
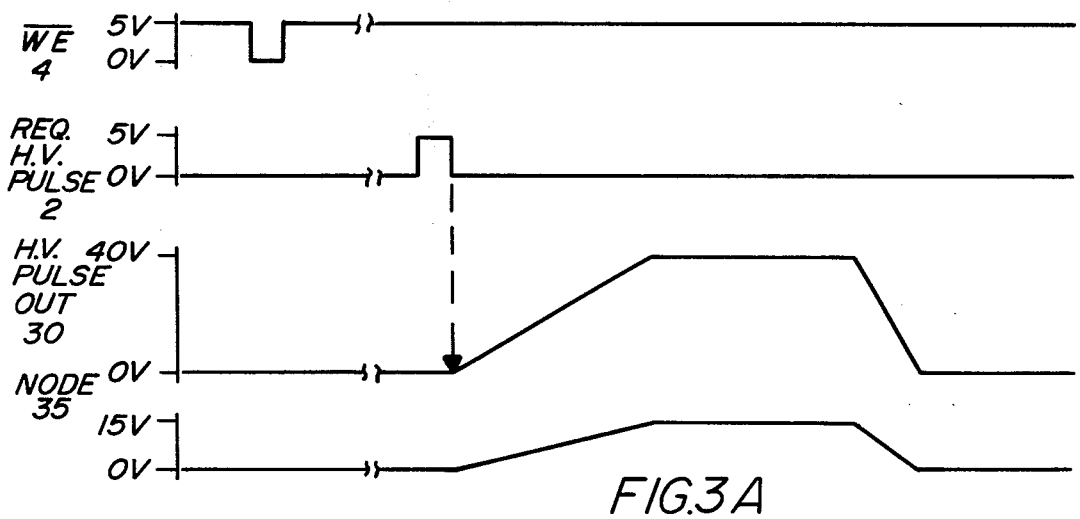
FIGS. 3A-3C are timing diagrams which illustrate the alternate modes of operation of the high voltage test circuit of FIG. 2.

Generally, the present invention is an integrated circuit testing apparatus operable in an integrated circuit through the use of one or more external pins that have one or more other independent functions, for monitoring or injecting a high voltage pulse without affecting the normal operation of circuits connected to this external pin, said testing circuit including means for enabling the circuit to be transparent to the normal operation of the integrated circuit; means responsive to a test signal on a first one of said external pins for coupling the present amplitude of the internal high voltage pulse to a second one of said external pins, and further including means responsive to said test signal on said first external pin for enabling a high voltage pulse of a selected magnitude and shape that is input to said second external pin to be coupled out to the rest of said integrated circuit in place of said internally generated high voltage pulse.

Turning now to the drawings, FIG. 1 illustrates a partial block diagram of an integrated circuit having a high voltage testing apparatus incorporated therein. As seen in FIG. 1, the high voltage test circuit is shown at 10. External signals to operate the high voltage test circuit 10 are coupled to circuit 10 via external pins 2 and 4. In one embodiment, these external signals, in their normal functioning mode, may respectively be a "REQUEST H.V. PULSE" signal and a write enable ($\overline{WE}$) signal. Both signals are preferrably logic level signals of 5 volts maximum. Such signals may be required in an integrated circuit such as a NOVRAM circuit which is a nonvolatile random access memory, wherein a high voltage pulse is needed to cause electrons to tunnel across a dielectric to a nonvolatile charge storage region. Data is written into RAM memory as a function of the level of the $\overline{WE}$ line and data is transferred from the random access memory to the nonvolatile memory in response to the high voltage pulse generated in response to a logic level signal on the REQUEST H.V. PULSE line. It should be realized that other logic level signal external pins may be used as multifunction pins according to the present invention, and that other devices besides NOVRAM memory circuits, e.g. EEPROMs electrically erasable programmable read only memories, may incorporate therein a high voltage test circuit 10 according to the present invention.

As further seen in FIG. 1, in a NOVRAM type of circuit, the REQUEST H.V. PULSE signal is normally fed via external pin 2 to logic circuitry 6 which acts to control a high voltage generator 8 in response to the receipt of such a request pulse. High voltage generator 8 acts in response to this signal to generate an internal high voltage pulse on line 30. Note that it is preferred that the high voltage generator be a generator positioned on the integrated circuit and powered only by a conventional logic level 5 volt power supply. The high voltage pulse generated by generator 8 causes electron tunneling to be initiated across a dielectric gap for either writing or erasing data contained on a nonvolatile memory element in the NOVRAM memory array. The $\overline{WE}$ signal is also shown as being input through an external pin 4 and fed both to the internal circuitry in the integrated circuit and to the high voltage test circuit 10.

Referring now to FIG. 2, disclosed is a preferred embodiment of a test circuit 10 as above described. Test circuit 10 provides preferably three separate modes of operation. In a first mode, the circuit 10 acts to maintain its transparency with respect to the normal operation of the REQUEST H.V. PULSE, the $\overline{WE}$ signal and the high voltage pulse output by generator 8. That is, this mode provides means for preventing testing circuit 10 from having any substantial effect on the normal operation of the integrated circuit. As described in more detail hereinbelow, this function is critically important since the high voltage generator 8 cannot be loaded down by the test circuit 10. Such a possibility is a significant problem, because the high voltages generated on the high voltage pulse output line 30, e.g. 40-45 volts, may cause voltage breakdown across circuits designed only to accommodate voltages in the 0-5 volt range. More on these effects is given hereinbelow. High voltage generator 8 is sensitive to the leakage current generated by such breakdown and other such loading effects and leakages, because it is a low power device that feeds a capacitive load, a necessary feature in enabling such a high voltage generator to be incorporated on an integrated circuit chip.

The second mode of operation of the high voltage test circuit 10 is where the test circuit 10 is enabled to monitor directly the exact amplitude and shape of the high voltage pulse that is output on line 30 by the high voltage generator 8. In this mode, this high voltage pulse is coupled out to external pin 2, the REQUEST H.V. PULSE pin, for external measurement of this high voltage pulse signal.

The advantage of monitoring the high voltage pulse in this manner is that prior art testing devices have only provided a means for indirectly measuring this voltage.

In a third mode, the high voltage test circuit 10 acts to enable a high voltage pulse to be injected on the REQUEST H.V. PULSE external pin 2 and be coupled out on internal line 30 as if this pulse had been generated by the high voltage generator 8. This latter function of the test circuit 10 is advantageous, since it enables a manufacturer to inject a pulse of known characteristics directly into the integrated circuit, bypassing or overriding the high voltage generator 8, to provide means for testing the effect of the externally generated high voltage pulse on the operation of the integrated circuit.

Referring now to the detailed embodiment of the test circuit shown in FIG. 2, the REQUEST H.V. PULSE external pin, identified as pin 2, is connectable to the output high voltage pulse 30 through transistors 38 and 40. The selection of either mode 1 or modes 2 and 3 is determined by the type of signal coupled to $\overline{WE}$ pin 4. The function of this gating signal on pin 4 is to either maintain transistor 40 in an off, or nonconductive state, to isolate external pin 2 from the high voltage pulse line 30 (mode 1), or to provide a means for biasing or precharging voltage on the base of transistor 40, to insure full conduction of the high voltage pulse bidirectionally either from external pin 2 to high voltage pulse line 30 or from high voltage pulse line 30 to external pin 2 (modes 2 and 3).

Specifically, the $\overline{WE}$ pin 4 is fed to a field oxide transistor 12. Field oxide transistor 12 is designed such that during normal operation of the $\overline{WE}$ signal, a signal of 0 to 5 volts maximum, field oxide transistor 12 remains off. With field oxide transistor 12 off, a depletion mode transistor 13 maintains the gate of a transistor 14 at a voltage sufficient to maintain transistor 14 in an on state, thereby grounding node 16. The gate of transistor 40, identified as node 28, is separated from node 16 by transistor 24. Transistor 24 is maintained in an on condition by means of the operation of transistor 52, which functions to bias node 56, the gate of transistor 24, at a minimum voltage of about 4 volts. Thus, with node 16 held at ground, due to the operation of transistor 14, node 28 is also held at ground via transistor 24, thereby maintaining transistor 40 in an off state. With transistor 40 off, the high voltage pulse line 30 is isolated from the REQUEST H.V. PULSE external pin 2.

However, due to the high level of voltage expected on high voltage pulse line 30, typically on the order of 40 volts, a single transistor 40 is insufficient to prevent gated diode breakdown, although it still would maintain isolation between high voltage line 30 and external pin 2. This breakdown would limit the operational level of the H.V. PULSE to the breakdown voltage, which would greatly interfere with circuit operations that depend on an adequate H.V. PULSE voltage level. Such breakdown occurs in standard gated field effect transistors, e.g. IGFET transistors, where a non-catastrophic voltage breakdown occurs at voltages exceeding typically 25 volts either between the drain and gate of the transistor or between the source and the gate thereof. This effect is called gated diode breakdown and occurs between the affected drain or source terminal of the transistor and the integrated circuit substrate. That is, for example, a leakage current is generated between the drain of the transistor and the substrate, thereby limiting the voltage that is maintainable between the drain and the gate of the transistor to this approximate 25 volt breakdown level. See, e.g. U.S. Pat. application Ser. No. 71,498, and now U.S. Pat. No. 4,326,134 for an Integrated Rise Time Regulated Voltage Generator System, which is incorporated herein by reference. This patent goes into more detail as to this gated diode breakdown effect. Consequently, since the high voltage pulse generated by high voltage generator 8 on line 30 exceeds this 25 volt margin, if the gate of transistor 40 is kept at ground, this leakage current generated by gated diode breakdown across transistor 40 would prevent the high voltage pulse from ever exceeding 25 volts.

To overcome the above problem, a second transistor 38 is added in series between transistor 40 and the high voltage pulse line 30. Further, to insure that transistor 38 does not have more than 25 volts developed across its drain to gate, the gate of transistor 38, node 35 is maintained at some positive voltage between the voltage on 30 and the voltage on node 28 during this first mode of operation of test circuit 10. This positive voltage biasing is provided by a capacitive voltage divider comprising capacitors 34 and 36, which is connected in series between line 30 and node 28. The center point between the two capacitors, node 35, is connected to the gate of transistor 38.

Thus, in operation, the test circuit 10 remains substantially transparent to the rest of the integrated circuit when the $\overline{WE}$ pulse is at some normal logic level, since this causes node 16 and thereby node 28 to remain at ground, thereby maintaining transistor 40 in an off condition. As seen in FIG. 3A, as the high voltage pulse 30 is generated, this increasing voltage is coupled through capacitor 34 to node 35 to increase the gate voltage on transistor 38. Thus, as the high voltage output pulse approaches 40 volts, the gate bias of transistor 38 is at perhaps 20 volts, thereby maintaining transistor 38 in an on condition and preventing the drain to gate voltage on either transistor 38 or transistor 40 from exceeding the gated diode breakdown voltage of approximately 25 volts. Thus, with transistor 40 off and transistor 38 in an on condition of such level to prevent gated diode breakdown, high voltage pulse 30 is effectively protected.

To initiate the operation of the high voltage test circuit 10 shown in FIG. 2, a higher level voltage signal is coupled to the $\overline{WE}$ external pin 4 of a magnitude at least sufficient to turn on the field oxide transistor 12. Transistor 12 preferably turns on after this voltage exceeds about 12 volts. This higher voltage at pin 4 therefore acts as means for gating on the test circuit 10. Specifically, with transistor 12 on, the operation of transistor 13 is overridden and the gate of transistor 14 is now held at ground. With the gate of 14 grounded, transistor 14 is off, thereby enabling node 16 to seek a level determined by other circuitry. The operation of node 16 and transistor 24 in modes 2 and 3 is to precharge node 28 to some predetermined voltage level, to thereby insure that transistor 40, and therewith transistor 38, are driven on a sufficient amount to enable some amount of the high voltage, whether it be generated by the high voltage generator 8 or from an external source via pin 2, to be coupled through transistors 38 and 40 without any substantial attenuation, thereby allowing the hereinafter described bootstrapping process to begin. This process ultimately results in a full high voltage signal being able to be coupled through these transistors 38 and 40.

Specifically, node 16 is caused to seek a higher voltage level by means of a chain of transistors 17, 18, 19, 20 and 21 which are connected as series diodes. Since the normal threshold voltage drop across the gate to source junction in such transistors is typically of the order of 1 volt, if the voltage on external pin 4 is raised to 18 to 20 volts, for example, the voltage on node 16 would, as a result, be between 13-15 volts. Node 16 is biased in modes 2 and 3 at this higher voltage to provide the initial precharge voltage level for node 28, with transistor 24 being on. Transistor 24 is maintained on in these modes, since its gate is also connected to external pin 4 through transistor 50, which is also arranged as a forward biased diode. Thus, with the $\overline{WE}$ signal being at 18-20 volts at external pin 4, node 56, the gate of transistor 24, is at between 17 and 19 volts, a sufficient voltage to maintain transistor 24 on with node 16 at 15 volts. Consequently, node 28 is precharged when the $\overline{WE}$ signal rises above the turn on voltage of transistor 12 to a level that is a function of the $\overline{WE}$ signal amplitude.

As previously mentioned, transistor 52 is provided to bias node 56 to approximately a 4 volt minimum voltage, to enable transistor 24 to remain on independent of the signal on external pin 4, which is needed in mode one to maintain node 28 at ground. Transistor 50 in this condition acts to prevent this 4 volt biasing signal from being coupled back to external pin 4 from node 56.

Transistor 54 is connected to provide control of the maximum voltage on node 56. Transistor 54 is oriented such that node 56 is prevented from exceeding a differential voltage with respect to ground of about 25 volts, since the gate of transistor 54 is tied to ground. Gated diode breakdown would occur from the drain of transistor 54 to the substate if node 56 rose above 25 volts. Note that in this configuration, the source side of transistor 54 need not be connected.

With node 28 precharged at substantially the voltage level of node 16, transistor 40 is immediately maintained in an on state. A capacitor 32 is connected between node 28 and the output high voltage pulse line 30, and provides means for bootstrapping this node 28 bias voltage, to maintain transistor 40 solidly in an on condition as the voltage of the high voltage pulse on line 30 rises, or alternatively as the voltage externally injected into the circuit from external pin 2 goes up.

Figure 3B:
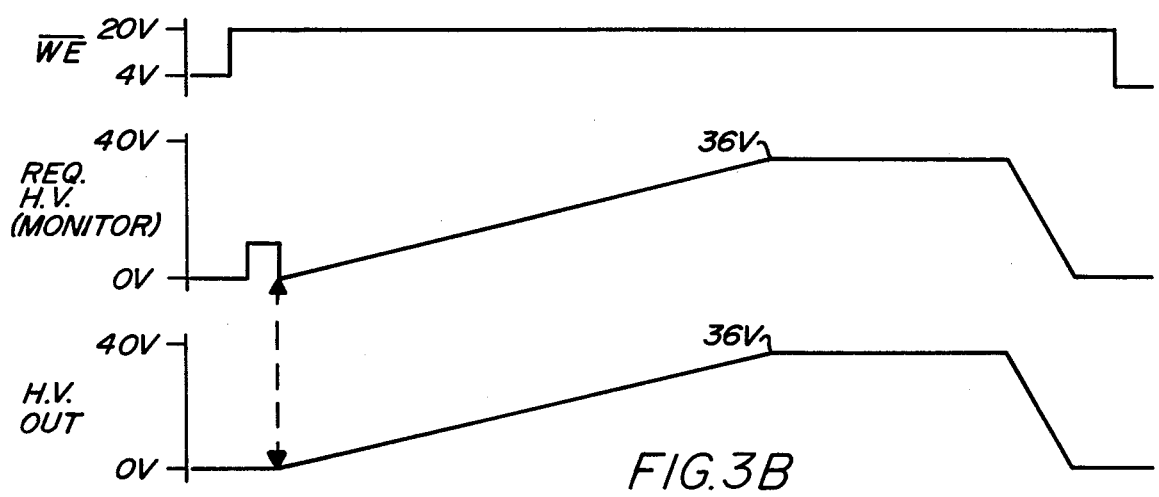

Referring first specifically to mode 2, wherein the high voltage pulse is generated by the high voltage generator 8 and is then monitored at external pin 2, as seen in FIG. 3B, circuit 10 operates to output through transistors 38 and 40 the present voltage level of the line 30 high voltage pulse to external pin 2. The bootstrapping means functions as follows. With node 28 initially at about 15 volts, transistor 40 is on, and transistor 38 is also on to a lesser extent through the operation of the capacitor voltage divider comprising capacitors 34 and 36. As the high voltage pulse on line 30 begins to rise, it is coupled, through the capacitive coupling of capacitor 32, to node 28, thereby maintaining node 28 always at about a 15 volt level in excess of the high voltage pulse level on line 30. Only when gated diode breakdown occurs through transistor 24 is the voltage on node 28 clamped. As node 28 rises in voltage, it maintains transistor 40 on sufficiently high enough to provide maximum conduction of the high voltage pulse 30 out to node 42, and thereby to external pin 2. Via the action of capacitors 34 and 36, node 35 is also maintained at a voltage that is in excess of the high voltage pulse 30, so that transistor 38 is also maintained sufficiently on to be fully conductive for the high voltage pulse on line 30. Although node 28 is limited by gated diode breakdown across transistor 24, this occurs only as node 28 exceeds approximately 44 volts. This is assuming that the voltage on node 56 provided by the $\overline{WE}$ signal from external pin 4 is equal to approximately 19 volts. Since the high voltage on line 30 is not expected to be above 44 volts in normal operation, even with node 28 limited to 44 volts by this junction diode breakdown, this is still sufficient enough voltage to maintain transistors 40 and 38 on sufficiently high enough to allow maximum coupling of the high voltage pulse from line 30 out to external pin 2. Note also that any other circuits connected to pin 2 for a normal operation in response to a REQUEST H.V. PULSE, can also be protected, if needed, from gated diode breakdown by means of a second, normally on transistor connected between pin 2 and such circuits, which goes off when $\overline{WE}$ goes above 12 volts.

Figure 3C:
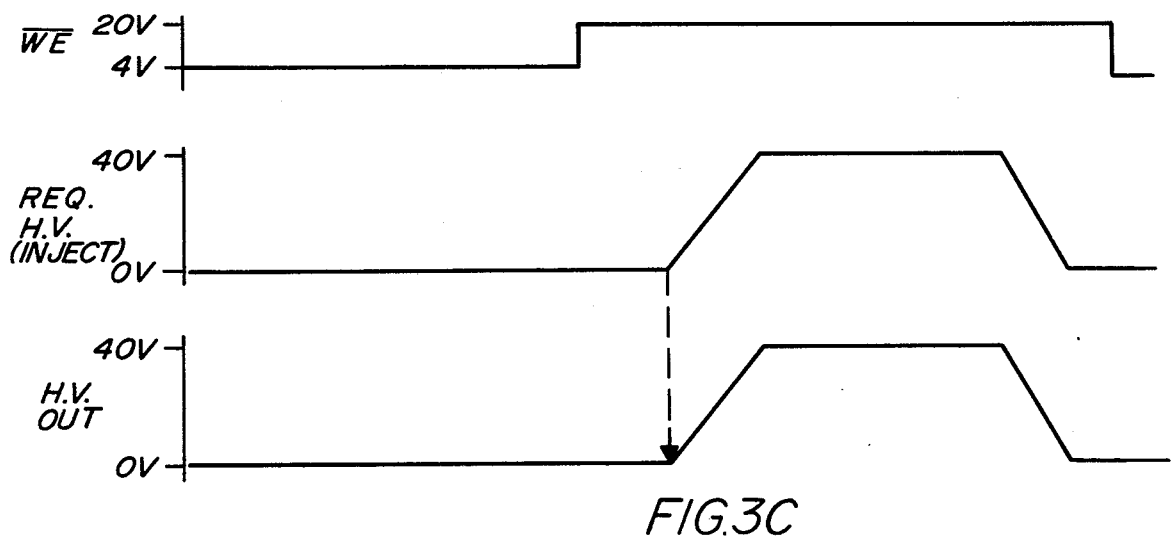

In mode 3, wherein a high voltage pulse is injected into external pin 2 and output on high voltage pulse line 30, an exemplary such externally generated high voltage pulse is illustrated in FIG. 3C along with the resultant high voltage pulse generated on line 30. A similar bootstrapping is provided by the test circuit 10 to enable transistors 38 and 40 to fully couple this injected high voltage pulse out on line 30. Specifically, as the external high voltage pulse rises in voltage, with node 28 precharged at 15 volts, initially transistors 40 and 38 are on sufficiently to allow this voltage to pass through to the high voltage pulse line 30. As the high voltage pulse on line 30 then begins to rise, this rising voltage creates a self-bootstrapping effect, since this voltage is also fed through capacitor 32 to node 28. As a result, node 28, and thereby the gate of transistors 40 and 38 begins to rise in voltage above this 15 volt precharged level. Thus, for example, if the externally injected high voltage level was at and rising through a 20 volt level, this 20 volt signal is coupled out to the high voltage pulse 30 and also self-bootstrapped through capacitor 32 to node 28, to about 35 volts, thereby insuring that transistors 40 and 38 are maintained in a sufficiently on state to fully couple the externally injected high voltage pulse to the high voltage pulse line 30.

FIG. 4 illustrates an alternate embodiment for gating on the high voltage test circuit 10 according to the present invention. The apparatus of FIG. 4 illustrates that it is within the scope of the present invention to provide for initiation of the operation of circuit 10 by means of the detection of a logic signal rather than by externally generating a positive 18–20 volt signal as above described for the circuit of FIG. 2. Specifically, any non-used logic state which may exist on one or more of the external pins of the integrated circuit, or internally thereto, can be taken advantage of, and a logic signal produced. An appropriate logic circuit may be used to initiate the operation of the high voltage test circuit 10. As seen in FIG. 4, for example, the logic signals from two external pins 100 and 102 may be added together in a logic element 104 for production of an output pulse only when both a signal on pin 100 and a signal on pin 102 exist. Such a logic level state may be non-used, for example if one of the pins represents a $\overline{WE}$ signal line, and the other pin functions to initiate an erase function. Of course, it would be within the ability of one having ordinary skill in the art to also provide logic element 104 with means for preventing this occurrence of simultaneous pulses on both pins 100 and 102 from causing any undesirable operation to occur in the rest of the integrated circuit. The output signal generated by logic element 104 can be fed to a conventional means for generating 20 volts, comprising a voltage generator 106. The output of this generator would be the 20 volt signal needed by the test circuit 10, in the preferred embodiment, to initiate its testing functions.

It should be obvious that the present invention would still work even if one or both external pins are not used for one or more other functions in the integrated circuit. Such a situation may be present where an integrated circuit in its normal configuration contains one or more such unused pins.

The apparatus of the present invention may also be used as a high voltage steering circuit. In such a circuit, a high voltage signal from any source could be coupled through the switch formed by transistors 40 and 38 to one or more predetermined destinations as a function of a control signal or signals generated either on chip or externally thereto.

It will, of course, be understood that modifications of the present invention and its various aspects will be apparent to those skilled in the art. As such, the scope of the present invention should not be limited by the particular embodiment and specific construction herein described, but should be defined only by the appended claims and equivalents thereof.

What is claimed is:

1. In an integrated circuit having a plurality of external pins through which one or more logic level signals are fed to the integrated circuit during normal operation, said circuit including means for generating a high voltage pulse of amplitude greater than the amplitude of said logic level signals at a predetermined internal point in said circuit, a testing circuit comprising:

means for detecting at a first one of said external pins an external signal of predetermined voltage amplitude in excess of any logic level signal normally input thereto;

means responsive to the detection of said external signal for coupling the present amplitude of said high voltage pulse at said internal point to a second one of said external pins; and means responsive to the absence of said external signal for isolating said internal point from said second external pin so as to enable the normal operation of said integrated circuit.

2. The integrated circuit of claim 1 wherein said testing circuit further comprises:
means responsive to said external signal for enabling a high voltage pulse of predetermined magnitude and shape externally generated and coupled to said second external pin to be coupled to said internal point.

3. The integrated circuit of claim 1 wherein said isolating means further comprises a plurality of field effect transistors each having a gated diode breakdown voltage level at which any voltage signal coupled to a transistor may be clamped, and means for preventing said gated diode breakdown of said field effect transistors when said high voltage pulse amplitude exceeds said gated diode breakdown voltage level at said internal point.

4. In an integrated circuit having a plurality of external pins through which one or more logic leval signals are fed to the integrated circuit during normal operation, a testing circuit for coupling a high voltage pulse of predetermined amplitude generated exterior to said integrated circuit to a predetermined internal point in said circuit comprising:
means responsive to an external signal applied to at least one of said external pins for enabling said high voltage pulse of predetermined magnitude and shape that is input to a second one of said external pins to be coupled to said internal point: and
means for preventing said testing circuit from effecting the operation of said integrated circuit in the absence of said external signal.

5. The integrated circuit of claim 4, wherein said external signal responsive means comprises means responsive to an external signal of magnitude higher than the voltage range of said logic level signals.

6. In an integrated circuit having a plurality of external pins through which one or more logic level signals are fed to the integrated circuit during normal operation, said circuit including means for generating at an internal point in said circuit a high voltage pulse of amplitude greater than the amplitude of said logic level signals, a testing circuit comprising:
means responsive to a voltage level on a first one of said external pins of a predetermined amplitude higher than any voltage level coupled to said first one of said external pins during normal operation of said integrated circuit for coupling the present amplitude of said high voltage pulse at said internal point to a second one of said external pins; and
means for preventing said testing circuit from effecting the normal operation of said integrated circuit in the absence of said higher voltage level.

7. The integrated circuit of claim 6 wherein said testing circuit further comprises:
means responsive to a voltage level on said first external pin of a predetermined amplitude higher than any normal voltage level coupled to said external pin during normal operation, for enabling a high voltage pulse of predetermined magnitude and shape that is input to said second external pin to be coupled to said internal point.

8. In an integrated circuit having a plurality of external pins through which one or more logic level signals and at least one power source are fed to the integrated circuit during normal operation, said circuit including means for generating at an internal point in said circuit a high voltage pulse of amplitude greater than the amplitude of said logic signals, a testing circuit comprising:
means responsive to a voltage level on a first one of said external pins of a predetermined amplitude higher than any normal voltage level coupled to said external pin during normal operation, for enabling a high voltage pulse of predetermined magnitude and shape that is input to a second one of said external pins to be coupled to said internal point, said input high voltage pulse overriding said internally generated high voltage pulse at said internal point; and
means for isolating said second external pin from said internal point in the absence of said higher than normal voltage level.

9. In an integrated circuit having a plurality of external pins each said external pin enabling logic level signal communication with the integrated circuit during normal operation, said circuit including means for generating at an internal point in said circuit a high voltage pulse of amplitude greater than the amplitude of said logic level signals, a testing circuit comprising:
means responsive to a voltage level on a first one of said external pins of a predetermined amplitude higher than any voltage level coupled to said first external pin during normal operation of said integrated circuit for coupling the present amplitude of said high voltage pulse at said internal point to a second one of said external pins; and
means for preventing said testing circuit from having any substantial effect on the normal operation of said integrated circuit, said means including at least two transistors connected in series between said internal point and said second one of said external pins, a first transistor connected closer to said internal point and a second transistor connected in series with said first transistor and connected closer to said second external pin, and means for biasing the gates of said transistors such that the maximum voltage on said internal point during normal operation of said integrated circuit is insufficient to create gated diode breakdown across either said first transistor or said second transistor, said biasing means including means responsive to the absence of a higher than normal voltage on said first one of said external pins for holding the gate of said second transistor at ground.

10. In an integrated circuit having a plurality of external pins through which one or more logic level signals and at least one power source are fed to the integrated circuit during normal operation, said circuit including means for generating at an internal point in said circuit a high voltage pulse of amplitude greater than the amplitude of said logic level signals, a testing circuit comprising:
first and second transistors connected in series between said internal point and a first one of said external pins, said second transistor connected adjacent said first one of said external pins;
capacitor divider means connected to the gate of each said transistor and to said internal point;
means for preventing said testing circuit from effecting the normal operation of said integrated circuit, said means including means for maintaining the gate of said second transistor at ground during the normal operation of said integrated circuit;
means responsive to a voltage level on a second one of said external pins of a predetermined magnitude higher than any normal voltage level coupled to said second one of said external pins during normal operation for decoupling said second transistor gate from ground and for precharging said second transistor gate to a predetermined voltage level;

means responsive to an increasing voltage on said first one of said external pins for causing an increased voltage to be coupled to said capacitor divider means such that said first and second transistors are maintained in an on state even if said increasing voltage exceeds said precharge voltage; and means responsive to an increasing voltage on said internal point to be coupled to said capacitor divider means such that said first and second transistors are maintained in an on state even if said increasing voltage exceeds said precharge voltage.

11. The integrated circuit of claim 10 wherein said prevention means includes field oxide transistor means operative to turn on when the voltage on said second external pin exceeds a predetermined voltage and means for isolating said second external pin and said field oxide transistor means from the gate of said second transistor when the voltage on said gate exceeds the gated diode breakdown potential of said field oxide transistor means.

12. The intergrated circuit of claim 1 wherein said coupling means comprises:

at least two field effect transistors connected in series between said internal point and said second external pins, a first transistor connected closer to said internal point and a second transistor connected closer to said second external pin such that a conductive path is generated between said internal point and said second external pin when sufficient voltage is present on the gates of both said transistors;

means for precharging the gate of said second transistor to a predetermined voltage level for initially biasing said second transistor to be in a conductive state when said external signal has been detected by said detecting means; and means for biasing the gates of said transistors as a function of said precharge voltage level and the voltage magnitude of said high voltage pulse.

13. The integrated circuit of claim 12 wherein said biasing means includes:

capacitor voltage divider means for biasing the gate of said first transistor at a voltage between said present amplitude of said high voltage and the voltage on the gate of said second transistor, said capacitor voltage divider means including a first capacitor connected between said internal point and the gate of said first transistor and a second capacitor connected between the base of said first transistor and the base of said second transistor; and a third capacitor connected between said internal point and the gate of said second transistor.

14. The integrated circuit of claim 12 wherein said isolating means further comprises:

means for biasing the gates of said transistors in the absence of said external signal such that a maximum voltage on said internal point in excess of the gated diode breakdown voltage level of field effect transistors is insufficient to create such gated diode breakdown across either of said transistors and such that no conductive path is generated between said internal point and said second external pin.

15. The integrated circuit of claim 14 wherein said biasing means includes capacitor voltage divider means for biasing the gate of said first transistor at a voltage between said present amplitude of said high voltage and the voltage on the gate of said second transistor, said capacitor voltage divider means including a first capacitor connected between said internal point and the gate of said first transistor and a second capacitor connected between the base of said first transistor and the base of said second transistor; and means for biasing said second transistor in a non-conductive state.

* * * * *